US012701753B2

(12) United States Patent
Kinoshita

(10) Patent No.: US 12,701,753 B2
(45) Date of Patent: Aug. 4, 2026

(54) SUPERJUNCTION SILICON CARBIDE SEMICONDUCTOR DEVICE HAVING TRENCH GATE STRUCTURES FORMED ON STACKED LAYERS OF PARALLEL PN JUNCTIONS EXTENDING IN DIFFERENT DIRECTIONS AND METHOD THEREOF

(71) Applicant: FUJI ELECTRIC CO., LTD.,
Kawasaki (JP)

(72) Inventor: Akimasa Kinoshita, Matsumoto-city (JP)

(73) Assignee: FUJI ELECTRIC CO., LTD.,
Kawasaki (JP)

( * ) Notice: Subject to any disclaimer, the term of this patent is extended or adjusted under 35 U.S.C. 154(b) by 481 days.

(21) Appl. No.: 16/773,276

(22) Filed: Jan. 27, 2020

(65) Prior Publication Data

US 2020/0295129 A1     Sep. 17, 2020

(30) Foreign Application Priority Data

Mar. 14, 2019     (JP) ................................. 2019-047715

(51) Int. Cl.
*H10D 30/01*     (2025.01)
*H10D 12/01*     (2025.01)
(Continued)

(52) U.S. Cl.
CPC ......... *H10D 62/111* (2025.01); *H10D 12/031* (2025.01); *H10D 30/0297* (2025.01);
(Continued)

(58) Field of Classification Search
CPC .............. H01L 29/634; H01L 29/1095; H01L 29/4236; H01L 29/7813; H10D 30/0297; H10D 30/668; H10D 62/111
See application file for complete search history.

(56) References Cited

U.S. PATENT DOCUMENTS

2006/0284248 A1     12/2006  Saito et al.
2012/0319136 A1*    12/2012  Noborio .............. H01L 29/1095
                                                                 257/77
(Continued)

FOREIGN PATENT DOCUMENTS

JP          2007036213 A       2/2007
JP          2008311261 A      12/2008
(Continued)

OTHER PUBLICATIONS

Office Action dated Jan. 31, 2023, in the counterpart of Japanese Patent Application No. 2019-047715.

*Primary Examiner* — Anh D Mai
(74) *Attorney, Agent, or Firm* — Rabin & Berdo, P.C.

(57)          ABSTRACT

A semiconductor device includes lower and upper parallel pn structures. The lower parallel pn structure is disposed at a first semiconductor layer and includes lower first columns of a first conductivity type and lower second columns of a second conductivity type, the lower first and second columns each having a stripe shape, extending in a first direction and being disposed repeatedly alternating with one another in a plane parallel to a front surface. The upper parallel pn structure is disposed at the lower parallel pn structure and includes upper first columns of the first conductivity type and upper second columns of the second conductivity type, the upper first and second columns each having a stripe shape, extending in a second direction different than the first direction and disposed repeatedly alternating with one another in a plane parallel to the front surface.

18 Claims, 7 Drawing Sheets

(51) Int. Cl.

| | | |
|---|---|---|
| *H10D 30/66* | (2025.01) |
| *H10D 62/10* | (2025.01) |
| *H10D 62/17* | (2025.01) |
| *H10D 62/832* | (2025.01) |
| *H10D 64/01* | (2025.01) |
| *H10P 30/22* | (2026.01) |

(52) U.S. Cl.
CPC ......... *H10D 30/668* (2025.01); *H10D 62/393* (2025.01); *H10D 62/8325* (2025.01); *H10D 64/01366* (2026.01); *H10P 30/22* (2026.01)

(56) References Cited

U.S. PATENT DOCUMENTS

| | | |
|---|---|---|
| 2015/0171169 A1 | 6/2015 | Harada |
| 2018/0197983 A1 | 7/2018 | Kinoshita et al. |
| 2020/0161467 A1 | 5/2020 | Takeuchi et al. |
| 2020/0168732 A1* | 5/2020 | Mitani ................ H01L 29/7813 |

FOREIGN PATENT DOCUMENTS

| | | | |
|---|---|---|---|
| JP | 2009-130106 A | 6/2009 |
| JP | 2019016775 A | 1/2019 |
| WO | 2013/179820 A1 | 12/2013 |
| WO | 2017/064949 A1 | 4/2017 |

\* cited by examiner

SUPERJUNCTION SILICON CARBIDE SEMICONDUCTOR DEVICE HAVING TRENCH GATE STRUCTURES FORMED ON STACKED LAYERS OF PARALLEL PN JUNCTIONS EXTENDING IN DIFFERENT DIRECTIONS AND METHOD THEREOF

CROSS REFERENCE TO RELATED APPLICATIONS

This application is based upon and claims the benefit of priority of the prior Japanese Patent Application No. 2019-047715, filed on Mar. 14, 2019, the entire contents of which are incorporated herein by reference.

BACKGROUND OF THE INVENTION

1. Field of the Invention

Embodiments of the invention relate to a superjunction silicon carbide semiconductor device and a method of manufacturing a superjunction silicon carbide semiconductor device.

2. Description of the Related Art

In a conventional silicon carbide metal oxide semiconductor field effect transistor (MOSFET), epitaxial growth and ion implantation are combined, thereby creating a high-quality interface between a gate oxide film and silicon carbide and realizing low resistance. Furthermore, by adopting a structure in which high electric field is not applied to the gate oxide film, a high-voltage semiconductor device that is highly reliable is realized (for example, refer to International Publication No. WO 2017/064949).

For example, to realize low resistance, a high-quality interface between the gate oxide film and silicon carbide is created and an impurity concentration of a junction field effect transistor (JFET) portion is increased, thereby realizing low resistance. Further, a p-type region for mitigating electric field is formed beneath a gate electrode, thereby realizing high voltage and high reliability. Further, a deep p-type region is formed beneath a contact region; and near the gate electrode, a flow of avalanche current that occurs when high voltage equal to or exceeding the performance limit is applied to a drain electrode is prevented, whereby load of the gate electrode is reduced. Further, by the deep p-type region beneath the contact region, even when a built-in diode operates, large current is prevented from flowing near the gate electrode, whereby the load of the gate electrode is reduced and reliability is enhanced.

Here, in a typical n-type channel vertical MOSFET, an n-type conductive layer (drift layer) is a semiconductor layer having the highest resistance of plural semiconductor layers formed in a semiconductor substrate. Electrical resistance of this n-type drift layer greatly affects the ON resistance of the vertical MOSFET overall. Reduction of the ON resistance of the vertical MOSFET overall may be realized by reducing the thickness of the n-type drift layer and shortening the current path.

However, the vertical MOSFET has a further function of sustaining withstand voltage by a spreading of a depletion layer to the high-resistance n-type drift layer in an OFF state. Therefore, when the n-type drift layer is made thinner to reduce the ON resistance, the spread of the depletion layer during the OFF state becomes shorter and therefore, critical electric field strength is easily reached by an application of a low voltage and the withstand voltage decreases. On the other hand, to increase the withstand voltage of the vertical MOSFET, the thickness of the n-type drift layer has to be increased, whereby the ON resistance increases. Such a relationship between ON resistance and withstand voltage is called a tradeoff relationship and enhancement of both subjects having a tradeoff relationship is generally difficult. This tradeoff relationship between ON resistance and withstand voltage is known to further exist similarly in other semiconductor devices such as insulated gate bipolar transistors (IGBTs), bipolar transistors, and diodes.

As a structure of a semiconductor device addressing problems such as those described above, superjunction (SJ) structure is known (for example, refer to International Publication No. WO 2013/0179820, Japanese Laid-Open Patent Publication No. 2009-130106). FIG. 8 is a perspective view of a structure of a conventional superjunction silicon carbide semiconductor device.

In FIG. 8, a MOSFET (hereinafter, SJ-MOSFET) having a superjunction structure is depicted as a superjunction silicon carbide semiconductor device 150. As depicted in FIG. 8, the SJ-MOSFET uses as a material, a wafer in which an n$^-$-type drift layer 102 is grown on a n$^+$-type silicon carbide semiconductor substrate 101 that has a high impurity concentration. From a surface of this wafer, p-type pillar regions 103 penetrating the n$^-$-type drift layer 102 and not reaching the n$^+$-type silicon carbide semiconductor substrate 101 are provided. While the p-type pillar regions 103 do not reach the n$^+$-type silicon carbide semiconductor substrate 101 in FIG. 8, the p-type pillar regions 103 may reach the n$^+$-type silicon carbide semiconductor substrate 101.

Further, the SJ-MOSFET has a parallel structure (hereinafter, parallel pn structure 121) in which, in the n$^-$-type drift layer 102, p-type regions (the p-type pillar regions 103) extending in a direction vertical to a substrate main surface and having a narrow width in a plane parallel to the substrate main surface and n-type regions (portions of the n$^-$-type drift layer 102 sandwiched by the p-type pillar regions 103, hereinafter, n-type pillar regions 104) are arranged repeatedly alternating each other in a plane parallel to the substrate main surface. The p-type pillar regions 103 and the n-type pillar regions 104 configuring the parallel pn structure 121 are regions in which the impurity concentration is increased relative to the n$^-$-type drift layer 102. In the parallel pn structure 121, the amounts of impurity contained in the p-type pillar regions 103 and the n-type pillar regions 104 are substantially equal, thereby enabling a high withstand voltage to be achieved by creating a pseudo non-doped layer in the OFF state.

In FIG. 8, reference numerals 105, 106, 107, 108, 109, 110, 111, 112, 113, and 116 represent an n-type high-concentration region, a p-type base layer, an n$^+$-type source region, a p$^{++}$-type contact region, a gate insulating film, a gate electrode, an interlayer insulating film, a source electrode, a back electrode, and a trench, respectively.

SUMMARY OF THE INVENTION

According to an embodiment of the present invention, a superjunction silicon carbide semiconductor device includes a silicon carbide semiconductor substrate of a first conductivity type, having a front surface and a back surface opposite to the front surface, a first semiconductor layer of the first conductivity type, provided on the front surface of the substrate, an impurity concentration of the first semiconductor layer being lower than an impurity concentration of the substrate, a lower parallel pn structure provided at a surface of the first semiconductor layer, and including a plurality of lower first columns of the first conductivity type and a plurality of lower second columns of a second conductivity type, the lower first columns and the lower second columns being disposed repeatedly alternating one another to form a striped pattern on a plane parallel to the front surface of the substrate, the lower first columns and the lower second columns extending in directions parallel to a first direction, an upper parallel pn structure provided at a surface of the lower parallel pn structure, and including a plurality of upper first columns of the first conductivity type and a plurality of upper second columns of the second conductivity type, the upper first columns and the upper second columns being disposed repeatedly alternating with one another to form a striped pattern on a plane parallel to the front surface of the substrate, the upper first columns and the upper second columns extending in direction parallel to a second direction different than the first direction, a second semiconductor layer of the second conductivity type, provided on a surface of the upper parallel pn structure, a first semiconductor region of the first conductivity type, selectively provided in a surface layer of the second semiconductor layer, a plurality of trenches, each of which penetrates the first semiconductor region and the second semiconductor layer, and reaches the upper parallel pn structure, a plurality of gate electrodes, each of which is provided in a corresponding one of the trenches via a gate insulating film, an interlayer insulating film provided on the gate electrodes, a first electrode in contact with the second semiconductor layer and the first semiconductor region, and a second electrode provided at the back surface of the substrate.

In the embodiment, the trenches form a striped planar pattern, and a lower end of each of the upper second columns is provided closer to the second electrode than is a bottom of each of the trenches, and each of the upper second columns extends in a direction parallel to directions in which the trenches extend.

In the embodiment, the trenches form a striped planar pattern, and a lower end of each of the upper second columns is provided closer to the second electrode than is a bottom of each of the trenches, and each of the upper second columns extends in a direction different than directions in which the trenches extend.

In the embodiment, the upper parallel pn structure or the lower parallel pn structure is configured by a multi-level parallel pn structure in which a plurality of first columns of the first conductivity type and a plurality of second columns of the second conductivity type are disposed repeatedly alternating with one another to form a striped pattern in respective planes that are parallel to the front surface, and the first columns and the second columns in one of the planes extend in directions parallel to the first direction, and the first columns and the second columns in another of the planes beneath the one plane extend in directions parallel to the second direction.

In the embodiment, the first direction and the second direction are 90° apart.

In the embodiment, the first direction and the second direction are 60° apart.

According to another embodiment of the present invention, a method of manufacturing a superjunction silicon carbide semiconductor device includes forming a first semiconductor layer of a first conductivity type on a front surface of a silicon carbide semiconductor substrate of the first conductivity type, an impurity concentration of the first semiconductor layer being lower than an impurity concentration of the substrate, forming, at a surface of the first semiconductor layer, a lower parallel pn structure in which a plurality of lower first columns of the first conductivity type and a plurality of lower second columns of a second conductivity type are disposed repeatedly alternating with one another to form a striped pattern in a plane parallel to the front surface of the substrate, the lower first columns and the lower second columns extending in directions parallel to a first direction, forming, at a surface of the lower parallel pn structure, an upper parallel pn structure in which a plurality of upper first columns of the first conductivity type and a plurality of upper second columns of the second conductivity type are disposed repeatedly alternating with one another to form a striped pattern in a plane parallel to the front surface of the substrate, the upper first columns and the upper second columns extending in directions parallel to a second direction different than the first direction, forming a second semiconductor layer of the second conductivity type on a surface of the upper parallel pn structure, selectively forming first semiconductor regions of the first conductivity type in a surface layer of the second semiconductor layer, forming trenches penetrating the first semiconductor regions and the second semiconductor layer and reaching the upper parallel pn structure, forming a plurality of gate electrodes in the trenches, each of the gate electrodes being provided in a corresponding one of the trenches, via a gate insulating film, forming an interlayer insulating film on the gate electrodes, forming a first electrode in contact with the second semiconductor layer and the first semiconductor regions, and forming a second electrode on a back surface of the substrate.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is a cross-sectional view of a structure of an active region and an edge termination region of the superjunction silicon carbide semiconductor device according to the embodiment.

DETAILED DESCRIPTION OF THE INVENTION

First, problems associated with the conventional techniques will be discussed. In a method of manufacturing a superjunction silicon carbide semiconductor device, since an impurity element does not substantially diffuse with silicon carbide, the parallel pn structure 121 is formed by a combination of epitaxial growth and ion implantation. Here, the n+-type silicon carbide semiconductor substrate 101 is provided with an off-angle for stable epitaxial growth and therefore, when epitaxial growth is performed on the n+-type silicon carbide semiconductor substrate 101, an alignment mark indicating ion implantation positions may be destroyed.

Figure 9:
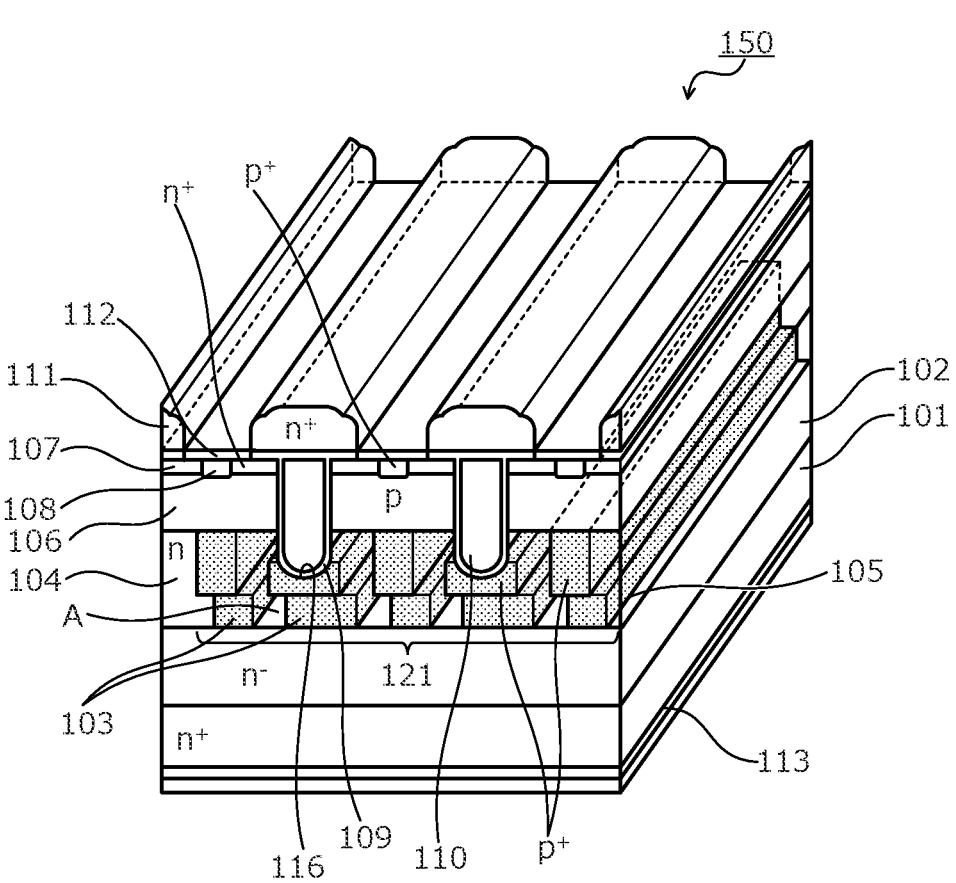
FIG. 9 is a perspective view of a structure of the conventional superjunction silicon carbide semiconductor device in which the p-type pillar regions have shifted.

Therefore, when epitaxial growth and ion implantation are combined to form the parallel pn structure 121, shifting of patterning may occur in the structure of the parallel pn structure 121 due to destruction of the alignment mark. FIG. 9 is a perspective view of a structure of the conventional superjunction silicon carbide semiconductor device in which the p-type pillar regions have shifted. As depicted in FIG. 9, shifting of the patterning has occurred in the p-type pillar regions 103. Due to this shifting of the patterning, widths of the n-type pillar regions are narrow at portions (regions A) and a problem arises in that variations in performance such as variations in the ON resistance occur.

Embodiments of a superjunction silicon carbide semiconductor device and a method of manufacturing a superjunction silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "-" means a bar added to an index immediately after the "-", and a negative index is expressed by prefixing "−" to the index.

Figure 1:
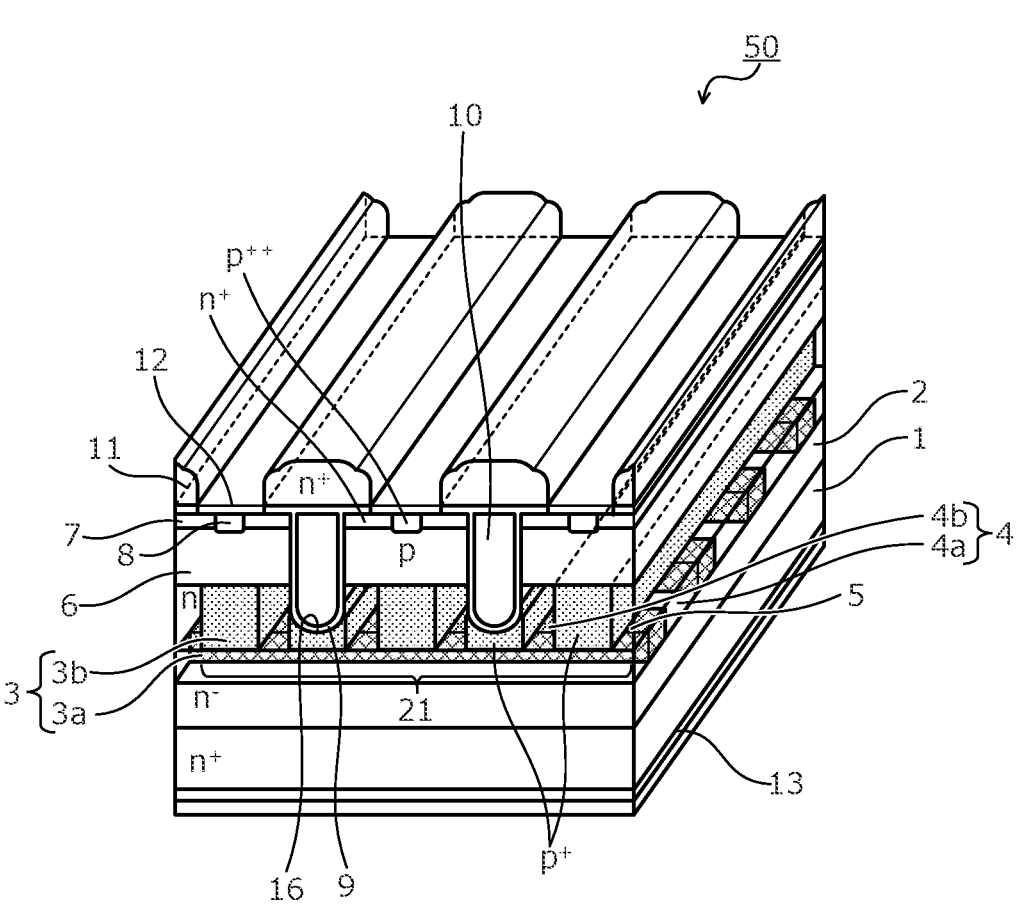
FIG. 1 is a perspective view of a structure of a superjunction silicon carbide semiconductor device according to an embodiment.
Figure 2:
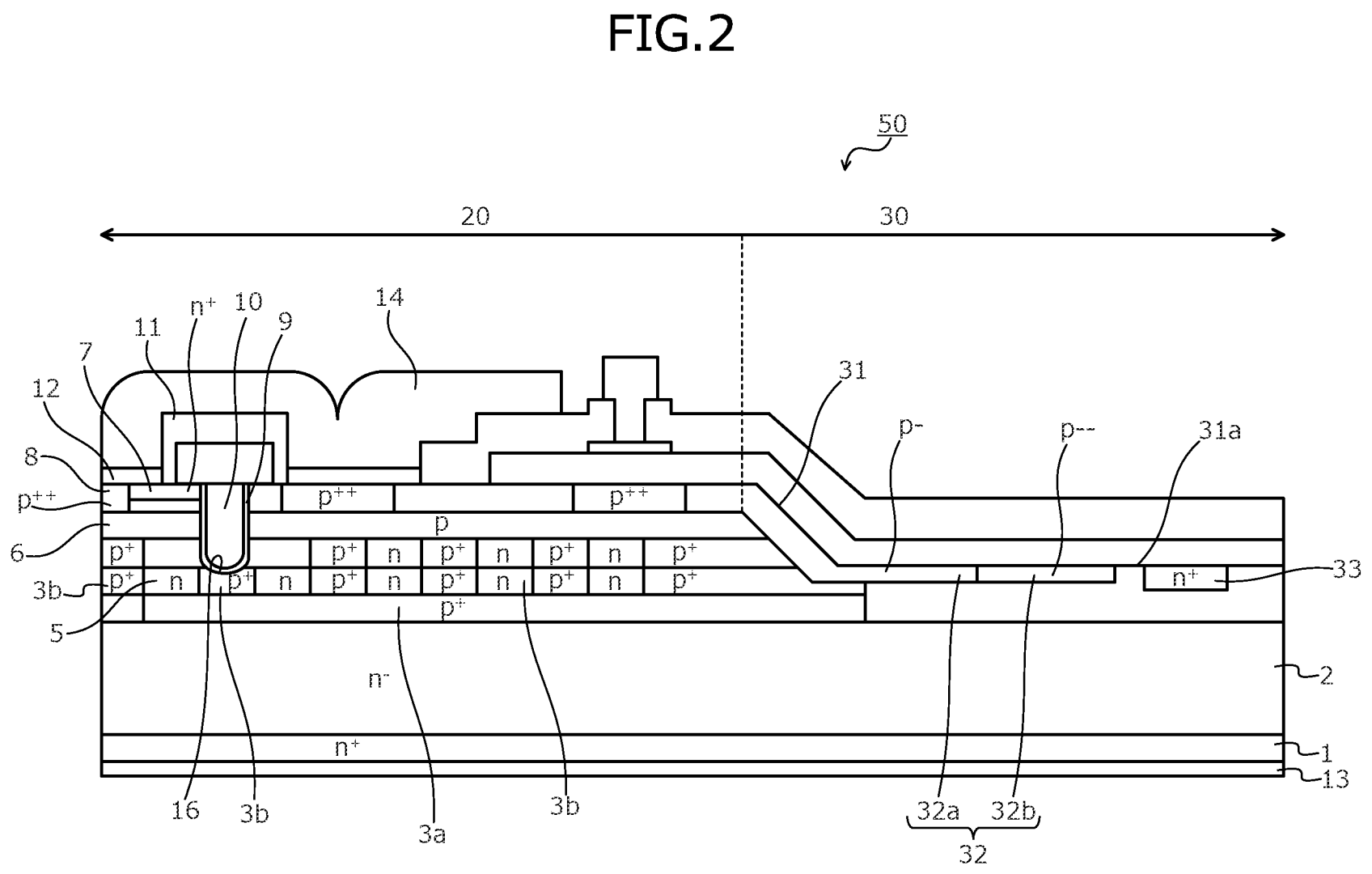

FIG. 1 is a perspective view of a structure of a superjunction silicon carbide semiconductor device according to an embodiment. FIG. 2 is a cross-sectional view of a structure of an active region and an edge termination region of the superjunction silicon carbide semiconductor device according to the embodiment.

The superjunction silicon carbide semiconductor device according to the present invention will be described taking a SJ-MOSFET 50 as an example. The SJ-MOSFET 50 depicted in FIG. 1 is a SJ-MOSFET that includes a metal oxide semiconductor (MOS) gate on a front surface (surface on a p-type base layer 6 (described hereinafter) side) side of a semiconductor base (silicon carbide base: semiconductor chip) containing silicon carbide (SiC). As depicted in FIG. 2, the SJ-MOSFET 50 includes an active region 20 and an edge termination region 30 surrounding a periphery of the active region 20. The active region 20 is a region through which current passes during an ON state. The edge termination region 30 is a region that mitigates electric field on a base front surface side of a drift region and that sustains withstand voltage. In FIG. 1, the active region 20 alone is depicted while a source electrode pad 14 described hereinafter is not depicted. In FIG. 1, only two unit cells (functional units of an element) are depicted while other unit cells adjacent to the two unit cells are not depicted. In the active region 20 depicted in FIG. 2, only one unit cell (functional unit of an element) is depicted while other unit cells adjacent to the one unit cell are not depicted.

As depicted in FIGS. 1 and 2, in the SJ-MOSFET 50 of the superjunction silicon carbide semiconductor device according to the embodiment, an n−-type drift layer (first semiconductor layer of the first conductivity type) 2 is deposited on a first main surface (front surface), for example, a (0001) plane (Si-face) of an n+-type silicon carbide substrate (silicon carbide semiconductor substrate of a first conductivity type) 1.

The n+-type silicon carbide substrate 1 is a silicon carbide single crystal substrate doped with, for example, nitrogen (N). The n−-type drift layer 2 is a low-concentration n-type drift layer doped with, for example, nitrogen at an impurity concentration lower than that of the n+-type silicon carbide substrate 1. At a surface of the n−-type drift layer 2, on a first side thereof opposite a second side thereof facing the n+-type silicon carbide substrate 1, a n-type high-concentration region 5 may be provided. The n-type high-concentration region 5 is a high-concentration n-type drift layer having an impurity concentration lower than that of the n+-type silicon carbide substrate 1 and higher than that of the n−-type drift layer 2.

At a first surface side of the n-type high-concentration region 5 (in a case in which the n-type high-concentration region 5 is not provided, the n−-type drift layer 2, hereinafter simply (2)) opposite a second surface side thereof facing toward the n+-type silicon carbide substrate 1, the p-type base layer (second semiconductor layer of a second conductivity type) 6 is provided. Hereinafter, the n+-type silicon carbide substrate 1, the n−-type drift layer 2, and the p-type base layer 6 are collectively regarded as a silicon carbide semiconductor base.

As depicted in FIGS. 1 and 2, at a second main surface (back surface, i.e., back surface of the silicon carbide semiconductor base) of the n+-type silicon carbide substrate 1, a back electrode (second electrode) 13 is provided. The back electrode 13 configures a drain electrode. At a surface of the back electrode 13, a drain electrode pad (not depicted) is provided.

In the n−-type drift layer 2 and the n-type high-concentration region 5 (2) of the SJ-MOSFET 50, a parallel pn structure 21 is provided. In the parallel pn structure 21, in a plane parallel the front surface of the n+-type silicon carbide substrate 1, n-type pillar regions 4 and p-type pillar regions 3 are disposed repeatedly alternating each other. The p-type pillar regions 3 are provided from the n−-type drift layer 2 so as not to reach the surface of the n+-type silicon carbide substrate 1.

The parallel pn structure 21 of the embodiment is configured by two levels, a lower parallel pn structure and an upper parallel pn structure. The lower parallel pn structure is formed by lower p-type pillar regions 3a and lower n-type pillar regions 4a that form a striped pattern, while the upper parallel pn structure is formed by upper p-type pillar regions 3b and upper n-type pillar regions 4b that form a striped pattern. Further, the p-type pillar regions 3 are configured by two levels, the lower p-type pillar regions 3a and the upper p-type pillar regions 3b while the n-type pillar regions 4 are configured by two levels, the lower n-type pillar regions 4a and the upper n-type pillar regions 4b.

The lower p-type pillar regions 3a and the upper p-type pillar regions 3b have a planar shape that is, for example, a striped shape, and the lower p-type pillar regions 3a and the upper p-type pillar regions 3b cross each other. The lower n-type pillar regions 4a and the upper n-type pillar regions 4b, similarly, cross each other. In the example depicted in FIG. 1, the lower p-type pillar regions 3a and the upper p-type pillar regions 3b are orthogonal to each other at a 90° angle and similarly the lower n-type pillar regions 4a and the upper n-type pillar regions 4b are orthogonal to each other at a 90° angle. Therefore, the planar shape of the parallel pn structure 21 of the embodiment is a lattice shape.

In this manner, the lower p-type pillar regions 3a and the upper p-type pillar regions 3b are disposed crossing each other, whereby when the upper p-type pillar regions 3b are formed on the lower p-type pillar regions 3a and shifting of patterning occurs, no change in the planar shape occurs. As a result, without changes in the current path, fluctuation of the ON resistance does not occur even when shifting of the patterning occurs. Therefore, adverse effects caused by shifting of the patterning when the parallel pn structure 21 is formed by a combination of epitaxial growth and ion implantation do not occur, thereby enabling variations in performance to be suppressed. Furthermore, defective products resulting from increased ON resistance caused by shifting of the patterning do not occur, thereby enabling manufacturing costs to be suppressed.

Further, in the example depicted in FIG. 1, while the parallel pn structure 21 is formed from two levels (the lower parallel pn structure and the upper parallel pn structure), the parallel pn structure 21 may be formed from three or more levels. Further, p-type regions in the parallel pn structure 21 such as the lower p-type pillar regions 3a and the upper p-type pillar regions 3b are called p-type pillar regions. For example, a height of the p-type pillar regions may be about 0.5 μm and the parallel pn structure 21 may be configured by about three or four levels. Here, when p-type pillar regions are formed beneath the p-type pillar regions described above, the p-type pillar regions and the lower p-type pillar regions are formed so as to cross each other. In this manner, even when the parallel pn structure 21 is formed having many levels and shifting of the patterning occurs at the levels, no changes in the current path occur and fluctuation of the ON resistance does not occur.

At a first main surface side of the silicon carbide semiconductor base (the p-type base layer 6 side), trench structures having a striped shape are formed. In particular, trenches 16, from a surface of the p-type base layer 6 on a first side of the p-type base layer 6 (the first main surface side of the silicon carbide semiconductor base) opposite a second side of the p-type base layer 6 facing toward the n+-type silicon carbide substrate 1, penetrate through the p-type base layer 6 and reach the n-type high-concentration region 5 (2). Along inner walls of the trenches 16, a gate insulating film 9 is formed at bottoms and side walls of the trenches 16, gate electrodes 10 of a striped shape are formed on the gate insulating film 9 in the trenches 16. The gate electrodes 10 are insulated from the n-type high-concentration region 5 (2) and the p-type base layer 6 by the gate insulating film 9. A portion of each of the gate electrodes 10 may protrude from tops of the trenches 16, toward a source electrode (first electrode) 12 described hereinafter. Further, the trenches 16 may be provided parallel to the off-angle of the n+-type silicon carbide substrate 1 because when orthogonal to the off-angle, shifting at the side walls of the trenches 16 occurs.

The upper p-type pillar regions 3b are provided between the trenches 16, in a surface layer on a first side (the first main surface side of the silicon carbide semiconductor base) of the n-type high-concentration region 5 (2), opposite a second side of the n-type high-concentration region 5 (2) facing toward the n+-type silicon carbide substrate 1, and beneath the trenches 16. A width of the upper p-type pillar regions 3b beneath the trenches 16 is wider than a width of the trenches 16.

Further, the upper p-type pillar regions 3b need not be provided beneath the trenches 16. In this case, the upper p-type pillar regions 3b are not present beneath the trenches 16, thereby enabling cell pitch to be reduced. Further, while the p-type regions are not in contact with the bottoms of the trenches 16, the lower p-type pillar regions 3a are provided and therefore, no problem occurs concerning the withstand voltage.

Further, in FIGS. 1 and 2, while the upper p-type pillar regions 3b are provided along a direction in which the striped shape of the trenches 16 extends, the upper p-type pillar regions 3b may be provided along a direction crossing the direction along which the striped shape of the trenches 16 extends. With such a configuration, even when the positions where the upper p-type pillar regions 3b are provided are shifted, instances in which the upper p-type pillar regions 3b are not present beneath the trenches 16 may be prevented.

For example, as charge balance of the parallel pn structure 21, an arithmetic product (amount of impurity) of the width of the p-type pillar regions 3 and an impurity concentration of the p-type pillar regions 3 is substantially equal to an arithmetic product (amount of impurity) of a width of the n-type pillar regions 4 and an impurity concentration of the n-type pillar regions 4, in particular, is within ±5% thereof. Therefore, the parallel pn structure 21 is known as a structure that concurrently obtains both properties of low ON resistance and high voltage characteristics.

Further, the charge balance may be set for each level. For example, an arithmetic product of the width of the lower p-type pillar regions 3a and the impurity concentration of the lower p-type pillar regions 3a is substantially equal to an arithmetic product of the width of the n-type pillar regions 4 at a depth equal to that of the lower p-type pillar regions 3a and the impurity concentration of the n-type pillar regions 4 at the depth equal to that of the lower p-type pillar regions 3a. In this case, the impurity concentration may be changed for each level. For example, configuration may be such that the impurity concentration decreases at each level, from upper levels (levels toward the source electrode 12) toward lower levels (levels toward back electrode 13). Further, a pitch of the parallel pn structure may differ for each level, for example, even when from the upper levels (levels toward the source electrode 12) toward the lower levels (levels toward the back electrode 13), the pitch is decreased at each level and a parallel pn count is increased, each pillar region of each level may assuredly be in contact with each other.

As depicted in FIG. 1, when the width of the upper p-type pillar regions 3b beneath the trenches 16 is wide due to the upper p-type pillar regions 3b between the trenches 16, the following occurs. The arithmetic product of the width of the upper p-type pillar regions 3b and the impurity concentration of the upper p-type pillar regions 3b is calculated by summing the arithmetic product of the width of the upper p-type pillar regions 3b between the trenches 16 and the impurity concentration of the upper p-type pillar regions 3b between the trenches 16 and the arithmetic product of the width of the upper p-type pillar regions 3b beneath the trenches 16 and the impurity concentration of the upper p-type pillar regions 3b beneath the trenches 16.

In a surface layer of the p-type base layer 6, an n+-type source region (first semiconductor region of the first conductivity type) 7 is selectively provided on a base first main surface side. Further, a p$^{++}$-type contact region 8 may be provided. The n$^+$-type source region 7 is in contact with the trenches 16. Further, the n$^+$-type source region 7 and the p$^{++}$-type contact region 8 are in contact with each other. Here, in the present description, the front surface indicates the first main surface, for example, a (0001) plane (Si-face) of the n$^+$-type silicon carbide substrate 1; being provided on a surface of a semiconductor layer indicates that further above the surface of the semiconductor layer, a semiconductor region/semiconductor layer is provided; and being provided in a surface layer of a semiconductor layer indicates that in the semiconductor layer, a semiconductor region/semiconductor layer exposed at the surface of the semiconductor layer is provided.

An interlayer insulating film 11, on the first main surface side of the silicon carbide semiconductor base overall, is provided so as to cover the gate electrodes 10 embedded in the trenches 16. The source electrode 12 is in contact with the n$^+$-type source region 7 and the p-type base layer 6, via contact holes opened in the interlayer insulating film 11. In a case in which the p$^{++}$-type contact region 8 is provided, the n$^+$-type source region 7 and the p$^{++}$-type contact region 8 are in contact with each other. The source electrode 12, for example, is formed by a NiSi film. The contact holes opened in the interlayer insulating film 11 have a striped shape corresponding to the gate electrodes 10. The source electrode 12 is electrically insulated from the gate electrodes 10 by the interlayer insulating film 11. On the source electrode 12, the source electrode pad 14 (not depicted in FIG. 1) containing Al or AlSi is provided. For example, a barrier metal (not depicted) containing Ti and TiN and preventing diffusion of metal atoms from the source electrode 12 toward the gate electrodes 10 may be provided between the source electrode 12 and the interlayer insulating film 11.

Further, as depicted in FIG. 2, in the edge termination region 30, a junction termination extension (JTE) structure is provided. In the edge termination region 30, the p-type base layer 6 is removed from the region overall, whereby a drop 31 where the edge termination region 30 is lower (recessed toward the back electrode 13) than the active region 20 is formed at the front surface of the silicon carbide base, the n$^-$-type drift layer 2 is exposed at a bottom 31a of the drop 31. Further, in the edge termination region 30, a JTE structure 32 is provided in which plural p$^-$-type low-concentration regions (herein, two, including from an inner side, a p$^-$-type, p$^{--}$-type indicated by reference characters 32a, 32b) are disposed adjacent to each other and the closer the p$^-$-type regions are disposed to an outer side (toward a chip end), the lower is an impurity concentration thereof. Further, an n$^+$-type semiconductor region 33 functioning as a channel stopper is provided at an outer side (side toward the chip end) of the JTE structure 32.

The p$^-$-type low-concentration region (hereinafter, first JTE region) 32a and the p$^{--}$-type low-concentration region (hereinafter, second JTE region) 32b are selectively provided at portions of the n$^-$-type drift layer 2 exposed at the bottom 31a of the drop 31, respectively. The first JTE region 32a extends along the drop 31 and is in contact with the p$^{++}$-type contact region 8 provided in the p-type base layer 6. A voltage withstanding structure is configured by the JTE structure 32.

Further, configuration may be such that in the edge termination region 30, for example, a voltage withstanding structure such as a field plate, RESURF, a p-type region configuring a guard ring, etc. is disposed. The withstand voltage is a voltage when a predetermined leak current flows and no destruction or errant operation of an element occurs.

Further, the parallel pn structure is also provided in the edge termination region 30. The parallel pn structure may be provided in all regions of the edge termination region 30 or as depicted in FIG. 2, may be provided to a position not reaching a border between the p$^-$-type low-concentration region 32a and the p$^{--}$-type low-concentration region 32b.

A method of manufacturing the superjunction silicon carbide semiconductor device according to the embodiment will be described. FIGS. 3, 4, 5, and 6 are cross-sectional views schematically depicting the superjunction silicon carbide semiconductor device according to the embodiment during manufacture.

First, the n$^+$-type silicon carbide substrate 1 containing silicon carbide of an n-type is prepared. Subsequently, on the first main surface of the n$^+$-type silicon carbide substrate 1, the n$^-$-type drift layer 2 containing silicon carbide is formed by epitaxial growth while an impurity of an n-type, for example, nitrogen atoms, is doped. Next, on the surface of the n$^-$-type drift layer 2, an n-type epitaxial layer doped with an impurity of an n-type such as nitrogen is formed.

Figure 3:
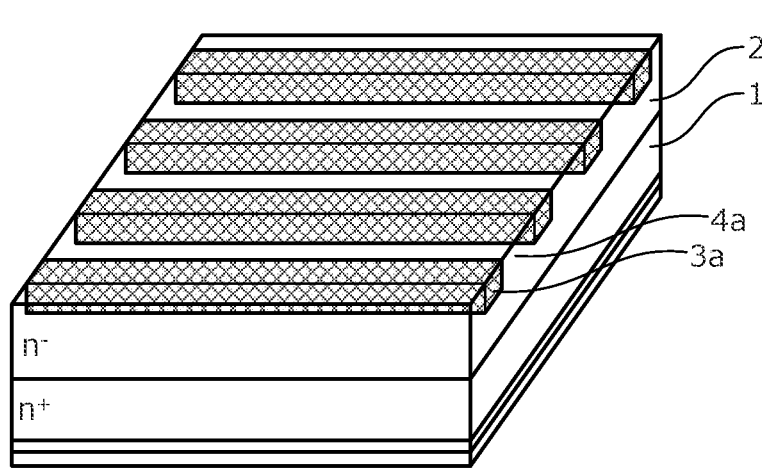
FIG. 3 is a cross-sectional view schematically depicting the superjunction silicon carbide semiconductor device according to the embodiment during manufacture.

Next, on the surface of the n-type epitaxial layer, by a photolithographic technique, an ion implantation mask having predetermined openings is formed using, for example, an oxide film. Subsequently, an impurity of a p-type such as aluminum is implanted in the openings of the oxide film, thereby forming the lower p-type pillar regions 3a. Here, the openings have a striped shape, whereby the lower p-type pillar regions 3a having a striped shape are formed. In the n-type epitaxial layer, regions sandwiched by the lower p-type pillar regions 3a become the lower n-type pillar regions 4a. Next, a portion of the ion implantation mask is removed. The state up to here is depicted in FIG. 3.

Next, on the surfaces of the lower p-type pillar regions 3a and of the lower n-type pillar regions 4a, an n-type epitaxial layer doped with an impurity of an n-type such as nitrogen is formed. Next, on the surface of the n-type epitaxial layer formed here, by a photolithographic technique, an ion implantation mask having predetermined openings is formed using, for example, an oxide film. Here, the openings of the ion implantation mask are formed in a striped shape and are formed so that a direction in which the openings extend crosses a direction in which the openings of the ion implantation mask used when forming the lower p-type pillar regions 3a extend. Subsequently, an impurity of a p-type such as aluminum is implanted in the openings of the oxide film, thereby forming first upper p-type pillar regions 3b1. In n-type epitaxial layer, regions sandwiched by the first upper p-type pillar regions 3b1 become first upper n-type pillar regions 4b1.

Figure 4:
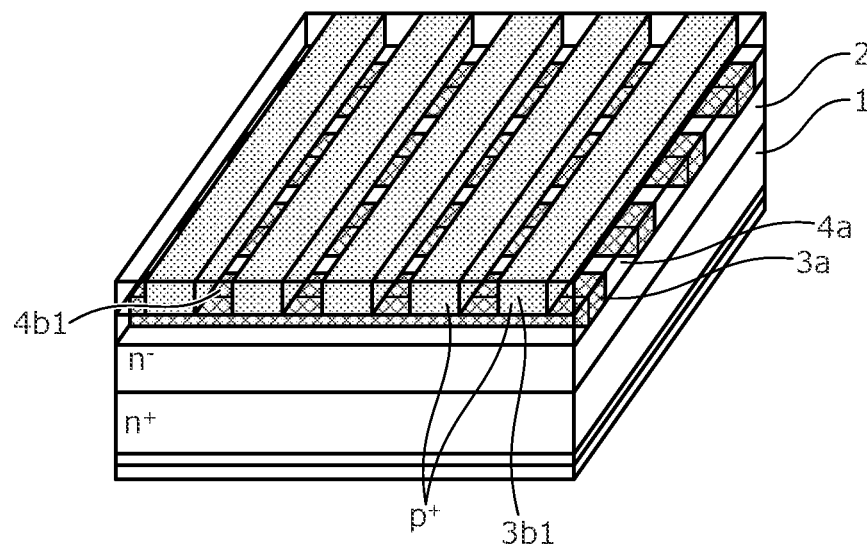
FIG. 4 is a cross-sectional view schematically depicting the superjunction silicon carbide semiconductor device according to the embodiment during manufacture.

Since such ion implantation are used for formation, formation is such that the direction in which the striped shape of the lower p-type pillar regions 3a and the lower n-type pillar regions 4a extends and the direction in which the striped shape of the first upper p-type pillar regions 3b1 and the first upper n-type pillar regions 4b1 extends cross. The state up to here is depicted in FIG. 4.

Next, on the surfaces of the first upper p-type pillar regions 3b1 and the first upper n-type pillar regions 4b1, the n-type high-concentration region 5 (in a case where the n-type high-concentration region is not to be formed, an n-type epitaxial layer, hereinafter, n-type epitaxial layer) doped with an impurity of an n-type such as nitrogen is formed. Next, on the surface of the n-type high-concentration region 5 (n-type epitaxial layer), by a photolithographic technique, an ion implantation mask having predetermined openings is formed using, for example, an oxide film. Here, the openings of the ion implantation mask are formed in a striped shape and are formed so that a direction in which the openings extend is parallel to the direction in which the openings of the ion implantation mask used when forming the first upper p-type pillar regions 3b1 extend. Furthermore, openings are not formed on the first upper p-type pillar regions 3b1 that are to be beneath the trenches 16. Subsequently, an impurity of a p-type such as aluminum is implanted in the openings of the oxide film, thereby forming second upper p-type pillar regions 3b2.

Figure 5:
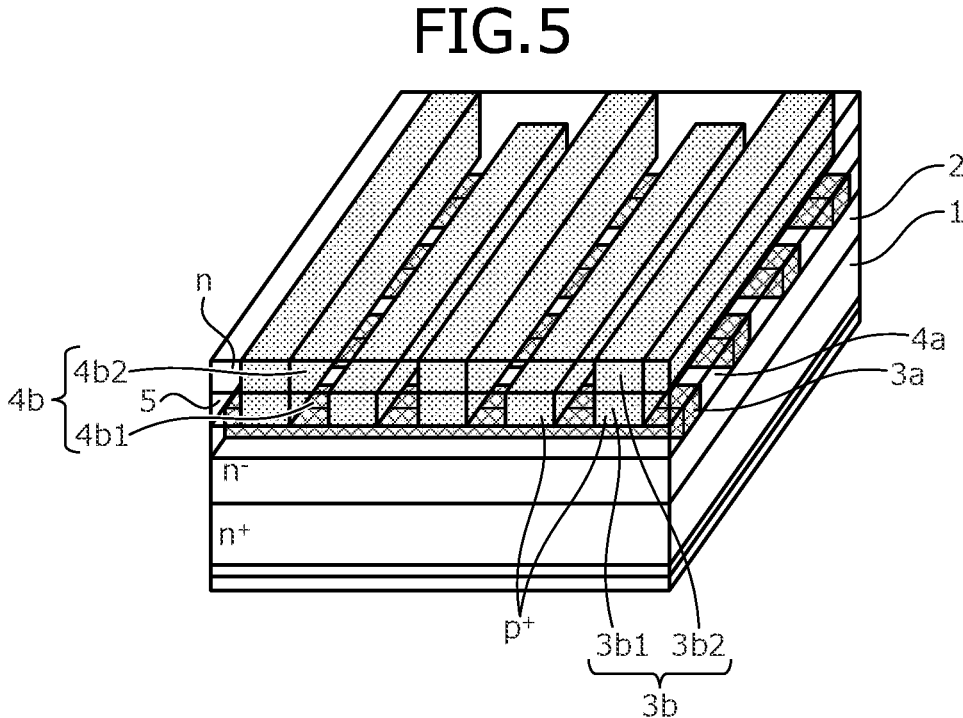
FIG. 5 is a cross-sectional view schematically depicting the superjunction silicon carbide semiconductor device according to the embodiment during manufacture.

Here, in the n-type high-concentration region 5 (n-type epitaxial layer), regions sandwiched by the second upper p-type pillar regions 3b2 become second upper n-type pillar regions 4b2. Further, the first upper p-type pillar regions 3b1 and the second upper p-type pillar regions 3b2 collectively are the upper p-type pillar regions 3b while the first upper n-type pillar regions 4b1 and the second upper n-type pillar regions 4b2 collectively are the upper n-type pillar regions 4b. Further, the lower p-type pillar regions 3a and the upper p-type pillar regions 3b collectively are the p-type pillar regions 3 while the lower n-type pillar regions 4a and the upper n-type pillar regions 4b collectively are the n-type pillar regions 4. In this manner, the parallel pn structure configured by the p-type pillar regions 3 and the n-type pillar regions 4 is formed. Next, a portion of the ion implantation mask is removed. The state up to here is depicted in FIG. 5.

In the embodiment up to here, while an n-type epitaxial layer is formed and an impurity of a p-type is ion implanted, the parallel pn structure may be formed by forming a p-type epitaxial layer and ion implanting an impurity of an n-type. In a case where an impurity of a p-type is ion implanted, the activation rate is unstable and therefore, ion implantation of an impurity of an n-type to form the parallel pn structure is more desirable.

Next, on the surfaces of the p-type pillar regions 3b and of the upper n-type pillar regions 4b, the p-type base layer 6 doped with a p-type impurity such as aluminum is formed. Next, on the surface of the p-type base layer 6, by photolithography, an ion implantation mask having a predetermined opening is formed using, for example, an oxide film. An impurity of an n-type such as phosphorus (P) is ion implanted in the opening, thereby forming the n$^+$-type source region 7 in a portion at the surface of the p-type base layer 6. Next, ion implantation mask used in forming the n$^+$-type source region 7 is removed and by a similar method, an ion implantation mask having predetermined openings may be formed, an impurity of a p-type such as aluminum may be ion implanted in portions of the surface of the p-type base layer 6, whereby the p$^{++}$-type contact regions 8 may be formed. An impurity concentration of the p$^{++}$-type contact regions 8 is set to be higher than an impurity concentration of the p-type base layer 6.

Next, by photolithography and etching, at the surface of the p-type base layer 6 in the edge termination region 30, a drop is formed at, for example, a depth of 0.3 μm and in the edge termination region 30, a thickness of the p-type base layer 6 is reduced, exposing the n$^-$-type drift layer 2. Next, on surfaces of the drop and of the n$^-$-type drift layer 2 in the edge termination region 30, by photolithography, an ion implantation mask having predetermined openings is formed using, for example, an oxide film. An impurity of a p-type is ion implanted in the openings, thereby forming the p$^-$-type low-concentration region 32a and the p$^{--}$-type low-concentration region 32b in portions of the surfaces of the drop and the n$^-$-type drift layer 2. Next, the ion implantation mask used in forming the p$^-$-type low-concentration region 32a and the p$^{--}$-type low-concentration region 32b is removed and by a similar method, an ion implantation mask having a predetermined opening is formed, an impurity of an n-type is ion implanted in a portion of the surface of the n$^-$-type drift layer 2, thereby forming the n$^+$-type semiconductor region 33. Next, the ion implantation mask used in forming the n$^+$-type semiconductor region 33 is removed.

Next, a heat treatment (annealing) in an inert gas atmosphere at about 1700 degrees C. is performed, implementing an activation process of the p-type pillar regions 3, the n$^+$-type source region 7, the p$^{++}$-type contact regions 8, etc. As described, ion implantation regions may be activated collectively by a single session of the heat treatment or may be activated by performing the heat treatment each time ion implantation is performed.

Figure 6:
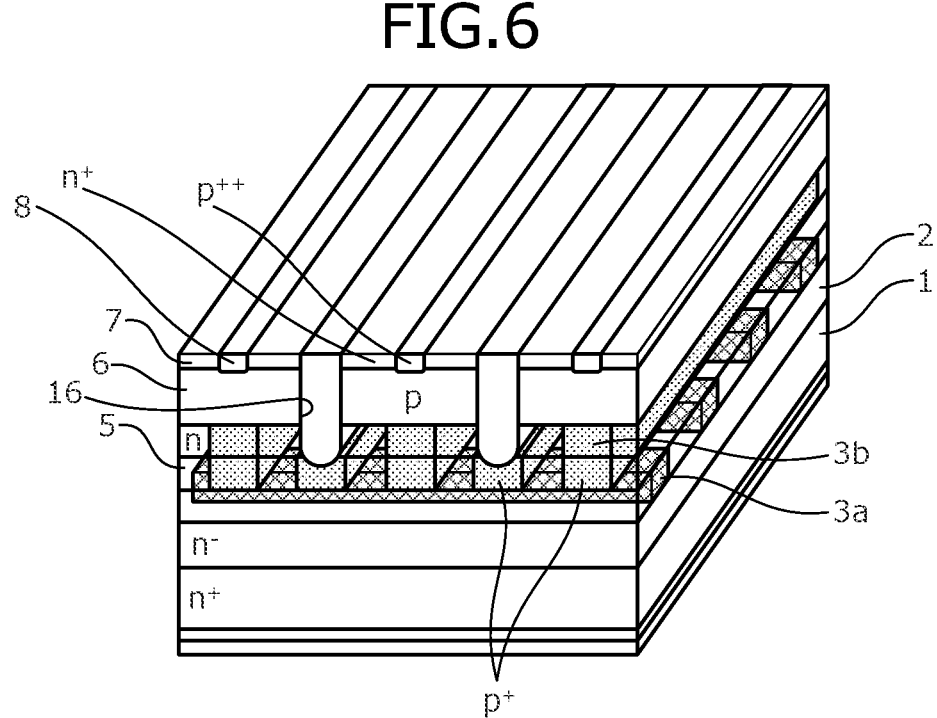
FIG. 6 is a cross-sectional view schematically depicting the superjunction silicon carbide semiconductor device according to the embodiment during manufacture.

Next, on the surface of the p-type base layer 6, by photolithography, a trench formation mask having predetermined openings is formed using, for example, an oxide film. Next, by dry etching, the trenches 16 are formed penetrating through the p-type base layer 6 and reaching the n-type high-concentration region 5 (2). The bottoms of the trenches 16 may reach the p-type pillar regions 3 formed in the n-type high-concentration region 5 (2). Next, the trench formation mask is removed. The state up to here is depicted in FIG. 6.

Next, the gate insulating film 9 is formed along the surface of the n$^+$-type source region 7 and the bottoms and side walls of the trenches 16. The gate insulating film 9 may be formed by thermal oxidation at a temperature of about 1000 degrees C. in an oxygen atmosphere. Further, the gate insulating film 9 may be formed by a method of depositing by a chemical reaction such as that for a high temperature oxide (HTO).

Next, on the gate insulating film 9, a polycrystalline silicon layer doped with, for example, phosphorus atoms is provided. The polycrystalline silicon layer may be formed so as to be embedded in the trenches 16. The polycrystalline silicon layer is patterned by photolithography to be left in the trenches 16, thereby forming the gate electrodes 10.

Next, for example, a phosphate glass is deposited to have a thickness of about 1 μm and cover the gate insulating film 9 and the gate electrodes 10, thereby forming the interlayer insulating film 11. Next, the barrier metal (not depicted) containing titanium (Ti) or titanium nitride (TiN) may formed so as to cover the interlayer insulating film 11. The interlayer insulating film 11 and the gate insulating film 9 are patterned by photolithography, thereby forming contact holes in which the n$^+$-type source region 7 and the p$^{++}$-type contact regions 8 are exposed. Thereafter, a heat treatment (reflow) is performed, thereby planarizing the interlayer insulating film 11.

Next, in the contact holes and on the interlayer insulating film 11, a conductive film forming the source electrode 12 is provided. The conductive film is selectively removed, leaving only the source electrode 12 in the contact holes, with the source electrode 12 being in contact with the n$^+$-type source region 7 and the p$^{++}$-type contact regions 8. Next, the source electrode 12 other than that in the contact holes is selectively removed.

Next, for example, by a sputtering method, on the source electrode 12 on the front surface of the silicon carbide semiconductor base and on an upper portion of the interlayer insulating film 11, an electrode pad becoming the source electrode pad 14 is deposited.

Next, on the second main surface of the n$^+$-type silicon carbide substrate 1, the back electrode 13 containing nickel or the like is provided. Thereafter, a heat treatment is performed in an inert gas atmosphere at a temperature of about 1000 degrees C., thereby forming an ohmic contact between the back electrode 13 and the n$^+$-type silicon carbide substrate 1. Thus, the silicon carbide semiconductor device depicted in FIGS. 1 and 2 is completed.

Figure 7:
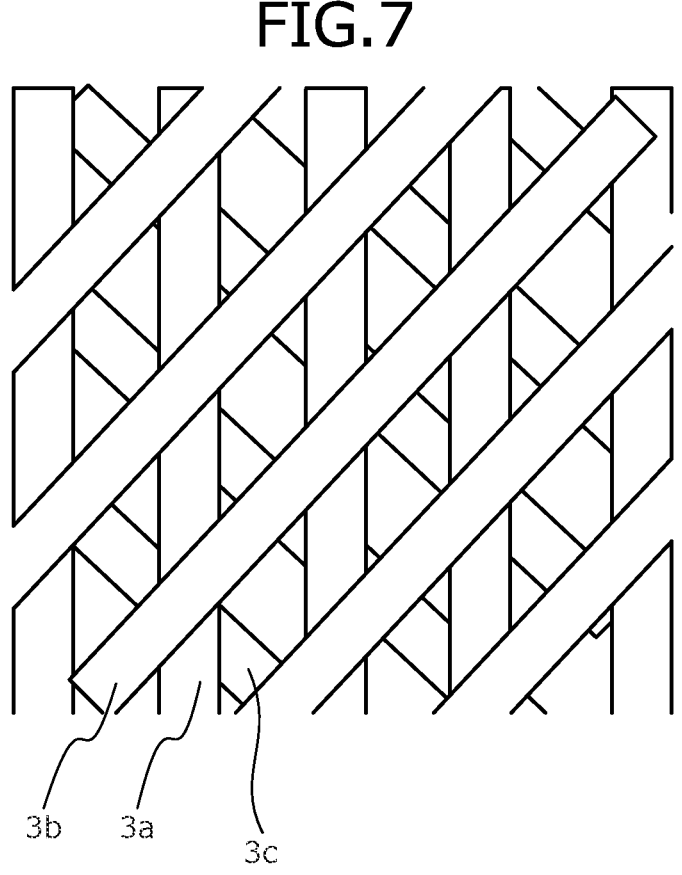
FIG. 7 is a top view of another parallel pn structure of the superjunction silicon carbide semiconductor device according to the embodiment.
Figure 8:
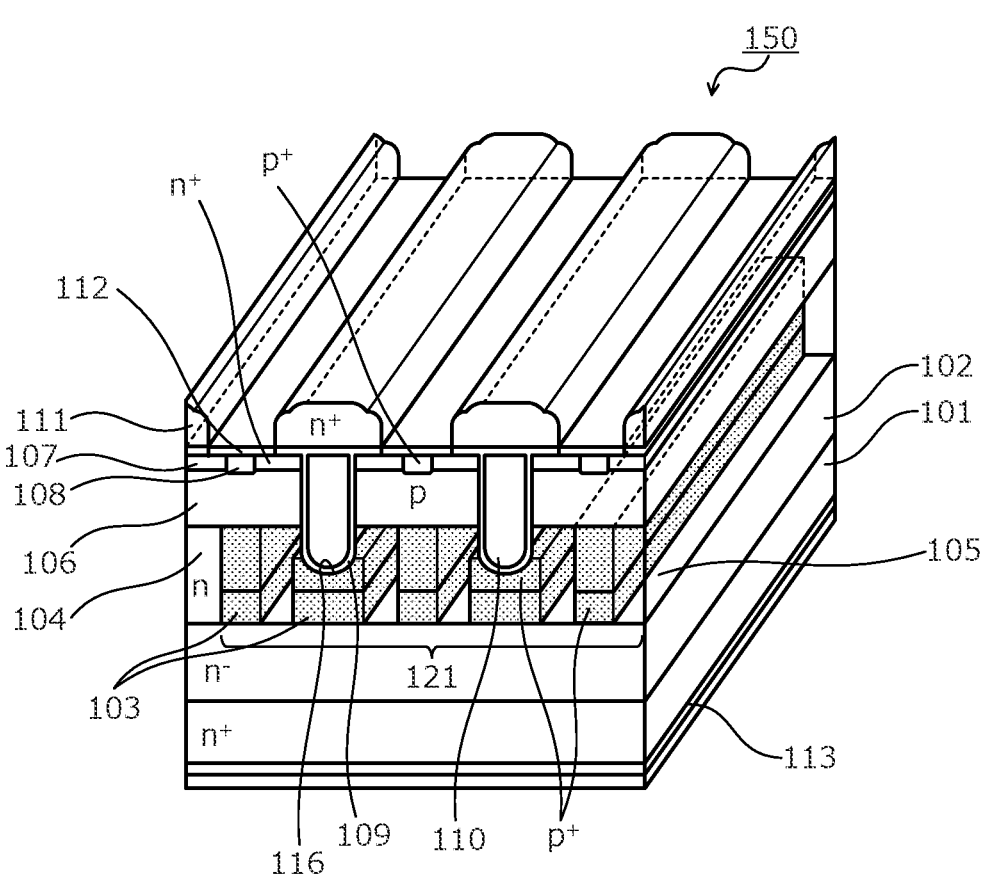
FIG. 8 is a perspective view of a structure of a conventional superjunction silicon carbide semiconductor device.

Here, FIG. 7 is a top view of another parallel pn structure of the superjunction silicon carbide semiconductor device according to the embodiment. As depicted in FIG. 7, configuration is that of a 3-level structure in which the parallel pn structure 21 is formed by bottom p-type pillar regions 3c, the lower p-type pillar regions 3a, and the upper p-type pillar regions 3b. In the parallel pn structure 21, the bottom p-type pillar regions 3c are provided on the n⁺-type silicon carbide substrate 1; and the lower p-type pillar regions 3a are provided on the bottom p-type pillar regions 3c; and the upper p-type pillar regions 3b are provided on the lower p-type pillar regions 3a.

Further, in the parallel pn structure 21, a direction in which a striped shape of the bottom p-type pillar regions 3c extends crosses at 60° the direction in which the striped shape of the lower p-type pillar regions 3a extends while the direction in which the striped shape of the lower p-type pillar regions 3a extends crosses at 60° the direction in which the striped shape of the upper p-type pillar regions 3b extends. When a 6H—SiC (6-layer periodic hexagonal crystal silicon carbide) is used as the n⁺-type silicon carbide substrate 1, the crystals have a hexagonal shape as viewed from a top surface and therefore, orientation of the crystals and the directions of the striped shapes of the bottom p-type pillar regions 3c, the lower p-type pillar regions 3a, and the upper p-type pillar regions 3b may be aligned. As a result, for example, when the bottom p-type pillar regions 3c, the lower p-type pillar regions 3a, and the upper p-type pillar regions 3b are formed, spreading of ions implanted at side surfaces thereof can be made the same, thereby enabling channeling to be prevented.

In the example depicted in FIG. 7, while configuration is that of a 3-level structure, in the 2-level structure like in FIGS. 1 and 2, the direction in which the striped shape of the lower p-type pillar regions 3a extends and the direction in which the striped shape of the upper p-type pillar regions 3b extends may cross at 60°. Further, a structure of 4 levels or more is further possible. In this case, the direction in which the striped shape of p-type pillar regions extends and the direction in which the striped shape of another p-type pillar regions provided on the p-type pillar regions extends cross at 60°.

Further, the upper p-type pillar regions 3b depicted in FIG. 7 may be provided in the direction D1 in which the striped shape of the trenches 16 extends, or the upper p-type pillar regions 3b may be provided in a direction D2 crossing the direction D1 in which the striped shape of the trenches 16 extends.

As described above, according to the superjunction silicon carbide semiconductor device according to the embodiment, the lower p-type pillar regions and the upper p-type pillar regions are provided crossing each other. As a result, when the parallel pn structure is formed by a combination of epitaxial growth and ion implantation and shifting of the patterning occurs, no change in the planar shape structure occurs. Therefore, without changes in the current path, fluctuation of the ON resistance does not occur even when shifting of the patterning occurs. Further, adverse effects caused by shifting of the patterning do not occur, thereby enabling variations in performance to be suppressed. Furthermore, defective products resulting from increased ON resistance caused by shifting of the patterning do not occur, thereby enabling manufacturing costs to be suppressed.

In the foregoing, while the present invention is described taking, as an example, a case in which a main surface of a silicon carbide substrate containing silicon carbide is a (0001) plane and on the (0001) plane, a MOS is configured, without limitation hereto, various modifications such as in a wide bandgap semiconductor material, orientation of the substrate main surface, etc. are possible.

Further, in the embodiment of the present invention, while a trench-type MOSFET is described as an example, without limitation hereto, application is further possible to semiconductor devices having various types of configurations such as MOS-type semiconductor devices like a planar-type MOSFET, IGBT, etc. Further, in the embodiments described above, while a case in which silicon carbide is used as a wide bandgap semiconductor material is described as an example, even when a wide bandgap semiconductor material other than silicon carbide such as gallium nitride (GaN) is used, similar effects are obtained. Furthermore, in the embodiments, while the first conductivity type is an n-type and the second conductivity type is a p-type, the present invention is similarly implemented when the first conductivity type is a p-type and the second conductivity type is an n-type.

According to the invention described above, the lower p-type pillar regions and the upper p-type pillar regions are provided crossing each other. As a result, when the parallel pn structure is formed by a combination of epitaxial growth and ion implantation and shifting of the patterning occurs, no change in the planar shape structure occurs. Therefore, without changes in the current path, fluctuation of the ON resistance does not occur even when shifting of the patterning occurs. Further, adverse effects caused by shifting of the patterning do not occur, thereby enabling variation in performance to be suppressed. Furthermore, defective products resulting from increased ON resistance caused by shifting of the patterning do not occur, thereby enabling manufacturing costs to be suppressed.

The superjunction silicon carbide semiconductor device and the method of manufacturing a superjunction silicon carbide semiconductor device according to the embodiment achieve an effect in that even when a parallel pn structure is formed by a combination of epitaxial growth and ion implantation, an occurrence of shifting of patterning may be suppressed.

As described, the superjunction silicon carbide semiconductor device and the method of manufacturing a superjunction silicon carbide semiconductor device according to the present invention are useful for high-voltage semiconductor devices used in power converting equipment and in power source devices of various types of industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A superjunction silicon carbide semiconductor device, comprising:
    a silicon carbide semiconductor substrate of a first conductivity type, having a front surface and a back surface opposite to the front surface;
    a first semiconductor layer of the first conductivity type, provided on the front surface of the substrate, an impurity concentration of the first semiconductor layer being lower than an impurity concentration of the substrate;
    a lower parallel pn structure provided at a surface of the first semiconductor layer, having a first surface and a second surface that are opposite to each other and parallel to the front surface of the substrate, and including a plurality of lower first columns of the first conductivity type and a plurality of lower second columns of a second conductivity type that are disposed repeatedly alternating with each other to form a stripe pattern on the second surface thereof, the lower first columns and the lower second columns extending in a first direction;

an upper parallel pn structure provided on the first surface of the lower parallel pn structure, having a first surface and a second surface that are opposite to each other and parallel to the front surface of the substrate, and including a plurality of upper first columns of the first conductivity type and a plurality of upper second columns of the second conductivity type that are disposed repeatedly alternating with each other to form a stripe pattern on the second surface thereof, the upper first columns and the upper second columns extending in a second direction different than the first direction;

a second semiconductor layer of the second conductivity type, provided on a surface of the upper parallel pn structure;

a first semiconductor region of the first conductivity type, selectively provided in a surface layer of the second semiconductor layer;

a plurality of trenches, each of which penetrates the first semiconductor region and the second semiconductor layer, and reaches the upper parallel pn structure;

a plurality of gate electrodes, each of which is provided in a corresponding one of the trenches via a gate insulating film;

an interlayer insulating film provided on the gate electrodes;

a first electrode in contact with the second semiconductor layer and the first semiconductor region; and a second electrode provided at the back surface of the substrate, wherein at the second surface of the upper parallel pn structure, in a direction orthogonal to the second direction, an arithmetic product of a width and an impurity concentration of each of the plurality of upper first columns and an arithmetic product of a width and an impurity concentration of each of the plurality of upper second columns differ by no more than 5% of each other, whereby the upper parallel pn structure is charge balanced as the superjunction silicon carbide semiconductor device, an impurity concentration of the upper first columns is lower than an impurity concentration of the first semiconductor region and higher than the impurity concentration of the first semiconductor layer, a bottom of each of the plurality of trenches is embedded in a corresponding one of the plurality of upper second columns, and the impurity concentration of each of the plurality of upper second columns and an impurity concentration of each of the plurality of lower second columns are higher than an impurity concentration of the second semiconductor layer.

2. The superjunction silicon carbide semiconductor device according to claim 1, wherein the trenches form a planar stripe pattern, and a lower end of each of the upper second columns is provided closer to the second electrode than is a bottom of each of the trenches, and each of the upper second columns extends in a direction parallel to directions in which the trenches extend.

3. The superjunction silicon carbide semiconductor device according to claim 1, wherein the trenches form a planar stripe pattern, and a lower end of each of the upper second columns is provided closer to the second electrode than is a bottom of each of the trenches, and each of the upper second columns extends in a direction different than directions in which the trenches extend.

4. The superjunction silicon carbide semiconductor device according to claim 1, wherein the upper parallel pn structure or the lower parallel pn structure is configured by a multi-level parallel pn structure in which a plurality of first columns of the first conductivity type are disposed repeatedly alternating with a plurality of second columns of the second conductivity type in each level of the multi-level parallel pn structure, to form a stripe pattern in respective planes of levels of the multi-level parallel pn structure that are parallel to the front surface, and the first columns and the second columns in one of the planes extend in the first direction, and the first columns and the second columns in another of the planes beneath the one plane extend in the second direction.

5. The superjunction silicon carbide semiconductor device according to claim 1, wherein the first direction and the second direction are 90° apart.

6. The superjunction silicon carbide semiconductor device according to claim 1, wherein the first direction and the second direction are 60° apart.

7. The superjunction silicon carbide semiconductor device according to claim 1, wherein at the second surface of the lower parallel pn structure in a direction orthogonal to the first direction, an arithmetic product of a width and an impurity concentration of each of the plurality of lower first columns and an arithmetic product of a width and the impurity concentration of each of the plurality of lower second columns differ by no more than 5% of each other, whereby the lower parallel pn structure is charge balanced as the superjunction silicon carbide semiconductor device.

8. The superjunction silicon carbide semiconductor device according to claim 1, wherein ones of the plurality of lower first columns or the plurality of lower second columns in the lower parallel pn structure are epitaxial layers doped with impurities of one of the first conductivity type or the second conductivity type, and the other ones of the plurality of lower first columns or the plurality of lower second columns in the lower parallel pn structure are ion implanted regions containing impurities of the other one of the first conductivity type or the second conductivity type.

9. The superjunction silicon carbide semiconductor device according to claim 1, wherein each of an adjacent two of the trenches that are adjacent to each other reaches a respective one of two of the upper second columns in the upper parallel pn structure, another one of the upper second columns formed between the two of the upper second columns being disposed between the adjacent two of the trenches.

10. The superjunction silicon carbide semiconductor device according to claim 1, wherein a bottom of each of the lower second columns is located at a position deeper than a bottom of a region of the second conductivity type of an edge termination region surrounding a periphery of an active region where the first electrode is provided.

11. The superjunction silicon carbide semiconductor device according to claim 1, wherein a bottom of each of the lower first columns and a bottom of each of the lower second columns are in contact with the first semiconductor layer.

12. The superjunction silicon carbide semiconductor device according to claim 1, wherein the lower first columns and the lower second columns of the lower parallel pn structure each have the same thickness.

13. A method of manufacturing a superjunction silicon carbide semiconductor device, the method comprising:

forming a first semiconductor layer of a first conductivity type on a front surface of a silicon carbide semiconductor substrate of the first conductivity type, an impurity concentration of the first semiconductor layer being lower than an impurity concentration of the substrate;

forming, at a surface of the first semiconductor layer, a lower parallel pn structure having a first surface and a second surface that are opposite to each other and parallel to the front surface of the substrate, and including a plurality of lower first columns of the first conductivity type and a plurality of lower second columns of a second conductivity type that are disposed repeatedly alternating with each other to form a stripe pattern on the second surface thereof, the lower first columns and the lower second columns extending in a first direction;

forming, on the first surface of the lower parallel pn structure, an upper parallel pn structure having a first surface and a second surface that are opposite to each other and parallel to the front surface of the substrate, and including a plurality of upper first columns of the first conductivity type and a plurality of upper second columns of the second conductivity type that are disposed repeatedly alternating with each other to form a stripe pattern on the second surface thereof, the upper first columns and the upper second columns extending in a second direction different than the first direction;

forming a second semiconductor layer of the second conductivity type on a surface of the upper parallel pn structure;

selectively forming first semiconductor regions of the first conductivity type in a surface layer of the second semiconductor layer;

forming a plurality of trenches penetrating through the first semiconductor regions and the second semiconductor layer and reaching the upper parallel pn structure;

forming a plurality of gate electrodes in the trenches, each of the gate electrodes being provided in a corresponding one of the trenches, via a gate insulating film;

forming an interlayer insulating film on the gate electrodes;

forming a first electrode in contact with the second semiconductor layer and the first semiconductor regions; and forming a second electrode on a back surface of the substrate, wherein at the second surface of the upper parallel pn structure, in a direction orthogonal to the second direction, an arithmetic product of a width and an impurity concentration of each of the plurality of upper first columns and an arithmetic product of a width and an impurity concentration of each of the plurality of upper second columns differ by no more than 5% of each other, whereby the upper parallel pn structure is charge balanced as the superjunction silicon carbide semiconductor device, an impurity concentration of the upper first columns is lower than an impurity concentration of the first semiconductor regions and higher than the impurity concentration of the first semiconductor layer, a bottom of each of the plurality of trenches is embedded in a corresponding one of the plurality of upper second columns, and the impurity concentration of each of the plurality of upper second columns and an impurity concentration of each of the plurality of lower second columns are higher than an impurity concentration of the second semiconductor layer.

14. The method of manufacturing a superjunction silicon carbide semiconductor device according to claim 13, wherein at the second surface of the lower parallel pn structure in a direction orthogonal to the first direction, an arithmetic product of a width and an impurity concentration of each of the plurality of lower first columns and an arithmetic product of a width and the impurity concentration of each of the plurality of lower second columns differ by no more than 5% of each other, whereby the lower parallel pn structure is charge balanced as the superjunction silicon carbide semiconductor device.

15. The method of manufacturing a superjunction silicon carbide semiconductor device according to claim 7, wherein the forming a lower parallel pn structure includes forming an epitaxial layer doped with impurities of one of the first conductivity type or the second conductivity type, and implanting impurities of the other one of the first conductivity type or the second conductivity type in the epitaxial layer, using a mask, whereby ones of the plurality of lower first columns or the plurality of lower second columns in the lower parallel pn structure are formed by the epitaxial layer doped with the impurities of one of the first conductivity type or the second conductivity type, and the other ones of the plurality of lower first columns or the plurality of lower second columns in the lower parallel pn structure are formed by ion implanted regions containing the impurities of the other one of the first conductivity type or the second conductivity type.

16. The method of manufacturing a superjunction silicon carbide semiconductor device according to claim 13, wherein the forming a plurality of trenches includes forming each of an adjacent two of the trenches that are adjacent to each other so as to reach a respective one of two of the upper second columns in the upper parallel pn structure and so that another one of the upper second columns formed between the two of the upper second columns is disposed between the adjacent two of the trenches.

17. The method of manufacturing a superjunction silicon carbide semiconductor device according to claim 13, wherein a bottom of each of the lower second columns is located at a position deeper than a bottom of a region of the second conductivity type of an edge termination region surrounding a periphery of an active region where the first electrode is provided.

18. The method of manufacturing a superjunction silicon carbide semiconductor device according to claim 13, wherein a bottom of each of the lower first columns and a bottom of each of the lower second columns are in contact with the first semiconductor layer.

* * * * *